(12) United States Patent
Shimodaira et al.

(10) Patent No.: US 9,711,476 B2
(45) Date of Patent: Jul. 18, 2017

(54) WIRING BOARD AND ELECTRONIC COMPONENT DEVICE

(71) Applicant: SHINKO ELECTRIC INDUSTRIES CO., LTD., Nagano-shi, Nagano (JP)

(72) Inventors: Tomoyuki Shimodaira, Nagano (JP); Takahiro Rokugawa, Nagano (JP); Hitoshi Kondo, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/174,440

(22) Filed: Jun. 6, 2016

(65) Prior Publication Data
US 2016/0365327 A1 Dec. 15, 2016

(30) Foreign Application Priority Data
Jun. 9, 2015 (JP) ................. 2015-116522

(51) Int. Cl.
*H01L 21/00* (2006.01)
*H01L 23/00* (2006.01)
*H01L 21/56* (2006.01)
*H01L 23/498* (2006.01)
*H01L 21/48* (2006.01)

(52) U.S. Cl.
CPC .......... *H01L 24/16* (2013.01); *H01L 21/4857* (2013.01); *H01L 21/563* (2013.01); *H01L 23/49811* (2013.01); *H01L 23/49822* (2013.01); *H01L 23/562* (2013.01); *H01L 2224/16238* (2013.01); *H01L 2924/15313* (2013.01); *H01L 2924/3512* (2013.01)

(58) Field of Classification Search
CPC ........................... H01L 24/16; H01L 23/3185
See application file for complete search history.

(56) References Cited

U.S. PATENT DOCUMENTS

| | | | |
|---|---|---|---|
| 7,397,000 B2 | 7/2008 | Shimoto et al. | |
| 7,566,834 B2 | 7/2009 | Shimoto et al. | |
| 8,772,951 B1 | 7/2014 | Kim et al. | |
| 2012/0074578 A1* | 3/2012 | Kobayashi | H01L 24/11 257/773 |
| 2015/0077963 A1* | 3/2015 | Adachi | H05K 1/144 361/803 |

* cited by examiner

*Primary Examiner* — William Harriston
(74) *Attorney, Agent, or Firm* — Rankin, Hill & Clark LLP

(57) ABSTRACT

A wiring board includes: an insulating layer; a pad including: an upper surface; a lower surface opposite to the upper surface; and a side surface between the upper surface and the lower surface, wherein the side surface and the lower surface of the pad are embedded in the insulating layer; and a metal post formed on the upper surface of the pad and including: an upper surface; a lower surface opposite to the upper surface; and a side surface between the upper surface and the lower surface, wherein a narrowed portion is formed in the side surface of the metal post.

19 Claims, 16 Drawing Sheets

(PARTIALLY ENLARGED SECTIONAL VIEW)

(PARTIALLY ENLARGED SECTIONAL VIEW)

(PARTIALLY ENLARGED SECTIONAL VIEW)

(PARTIALLY ENLARGED SECTIONAL VIEW)

(PARTIALLY ENLARGED SECTIONAL VIEW)

US 9,711,476 B2

WIRING BOARD AND ELECTRONIC COMPONENT DEVICE

This application claims priority from Japanese Patent Application No. 2015-116522, filed on Jun. 9, 2015, the entire contents of which are herein incorporated by reference.

BACKGROUND

1. Technical Field

The present disclosure relates to a wiring board and an electronic component device.

2. Description of the Related Art

In the related arts, wiring boards for mounting electronic components such as semiconductor chips are known. In such a wiring board, a terminal of a semiconductor chip is flip-chip connected to a pad exposed from an insulating layer (see e.g., U.S. Pat. No. 7,397,000 B2, U.S. Pat. No. 7,566,834 B2 and U.S. Pat. No. 8,772,951 B1).

As will be described in preliminary matters below, a pad is disposed in an insulating layer to sink internally downward from an upper surface of the insulating layer in a coreless type wiring board. Therefore, when a bump electrode of a semiconductor chip is flip-chip connected to the pad of the wiring board, a residue of a sealing resin material occurs in a connection portion easily.

In addition, assume that a metal post is formed on the pad of the coreless type wiring board. In this case, when the bump electrode of the semiconductor chip is connected to the pad of the wiring board by a solder, stress is concentrated on upper end corner portions of the metal post so that cracks occur easily in the solder.

Thus, there is a likelihood that satisfactory reliability in connection cannot be obtained when the semiconductor chip is flip-chip connected in the coreless type wiring board.

SUMMARY

According to one or more aspects of the present disclosure, there is provided a wiring board. The wiring board includes: an insulating layer; a pad including: an upper surface; a lower surface opposite to the upper surface; and a side surface between the upper surface and the lower surface, wherein the side surface and the lower surface of the pad are embedded in the insulating layer; and a metal post formed on the upper surface of the pad and including: an upper surface; a lower surface opposite to the upper surface; and a side surface between the upper surface and the lower surface, wherein a narrowed portion is formed in the side surface of the metal post.

According to one or more aspects of the present disclosure, the electronic component can be connected highly reliably in a coreless type wiring board.

DETAILED DESCRIPTION

Embodiments will be described below respectively with reference to the accompanying drawings. Incidentally, a characteristic part is enlarged and shown in some accompanying drawings for convenience's sake in order to make it easy to understand that characteristic, and the dimensional ratios etc. of respective constituent elements do not always agree with real ones. In addition, hatching of a part of members is omitted in each sectional view in order to make it easy to understand the sectional structure of each member.

Preliminary matters underlying the embodiments will be described prior to description of the embodiments.

FIGS. 1A to 1C and FIGS. 2A to 2C are views for describing problems of wiring boards according to the preliminary matters. The description of the preliminary matters contains the details of personal study of the present inventor rather than known techniques.

Figure 1A:
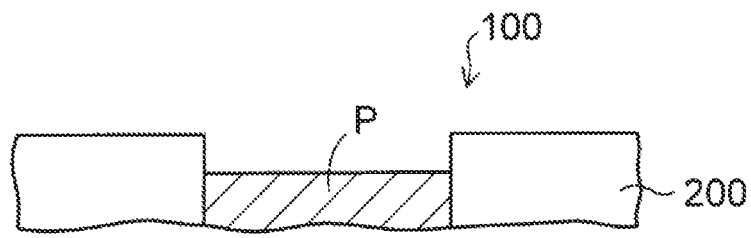
FIGS. 1A to 1C are sectional views for describing a problem of a wiring board according to a preliminary matter (part 1)

As shown in FIG. 1A, a coreless type wiring board 100 is prepared. The periphery of a pad P in a component mounting region of the coreless type wiring board 100 is partially shown in FIG. 1A. In the coreless type wiring board 100, a side surface and a lower surface of the pad P are embedded in an insulating layer 200 and an upper surface of the pad P is exposed from the insulating layer 200 to serve as a connection portion.

To manufacture the coreless type wiring board 100, first, a multilayer wiring including the pad P made of copper in the bottom is formed on a copper foil which is formed on a temporary substrate to be removable from the temporary substrate. After the temporary substrate is released and separated from the copper foil, the copper foil is then removed by wet etching.

While the copper foil is wet-etched, the exposed pad P (copper) is also etched. Accordingly, as shown in FIG. 1A, the pad P sinks internally downward from an upper surface of the insulating layer 200.

Figure 1B:
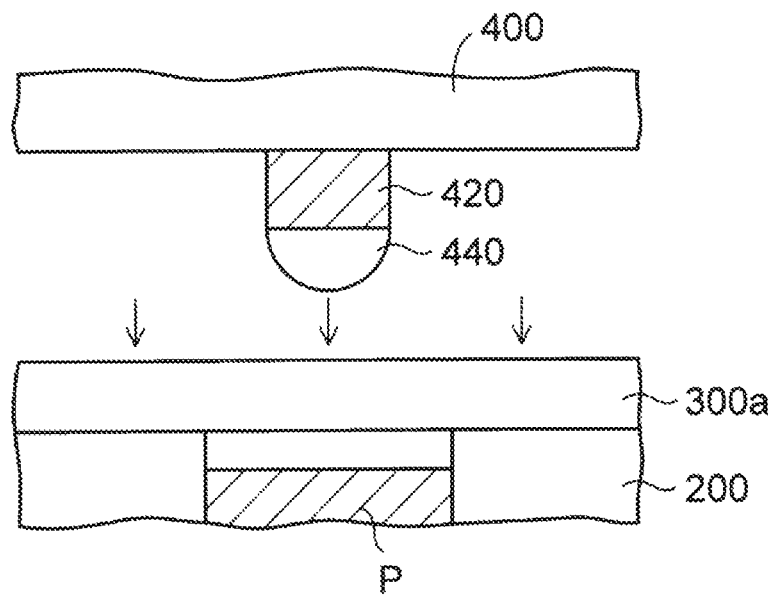

Next, as shown in FIG. 1B, a sealing resin material 300a is disposed on the wiring board 100. A semiconductor chip 400 is further prepared. The semiconductor chip 400 has a bump electrode 420 provided in its lower surface. A solder 440 is formed at a front end of the bump electrode 420.

Figure 1C:
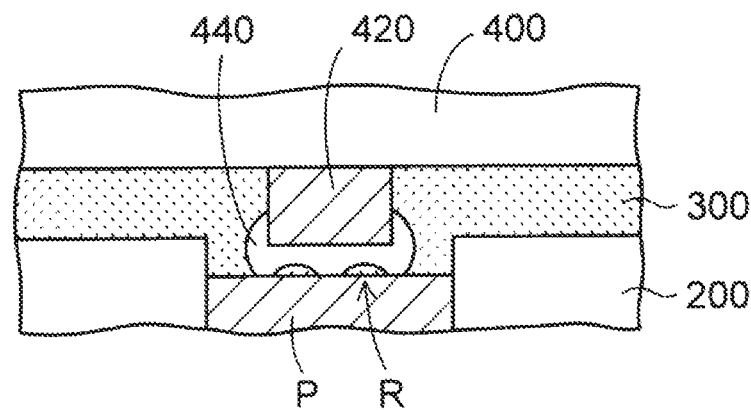

As shown in FIG. 1C, when the bump electrode 420 of the semiconductor chip 400 is pushed into the sealing resin material 300a on the wiring board 100, the bump electrode 420 of the semiconductor chip 400 is pressed against the pad P of the wiring board 100.

Further, by reflow heating, the solder 440 at the front end of the bump electrode 420 of the semiconductor chip 400 is melted so that the bump electrode 420 of the semiconductor chip 400 can be flip-chip connected to the pad P of the wiring board 100 through the solder 440.

During the reflow heating, the sealing resin material 300a in a semi-cured state is cured simultaneously so that a lower side of the semiconductor chip 400 can be filled with a cured sealing resin 300. In this manner, the sealing resin 300 can be formed on the lower side of the semiconductor chip 400.

On this occasion, the pad P of the wiring board 100 sinks internally downward from the upper surface of the insulating layer 200. Therefore, a side wall of a recess of the insulating layer 200 is disposed around the pad P. In this manner, the sealing resin material 300a immediately under the bump electrode 420 of the semiconductor chip 400 is dammed by the side wall of the recess of the insulating layer 200 to thereby make it difficult to flow horizontally. Accordingly, a residue R of the sealing resin material 300 occurs easily.

Therefore, there is a problem that it is not possible to obtain satisfactory reliability in connection between the bump electrode 420 of the semiconductor chip 400 and the pad P of the wiring board 100.

Figure 2A:
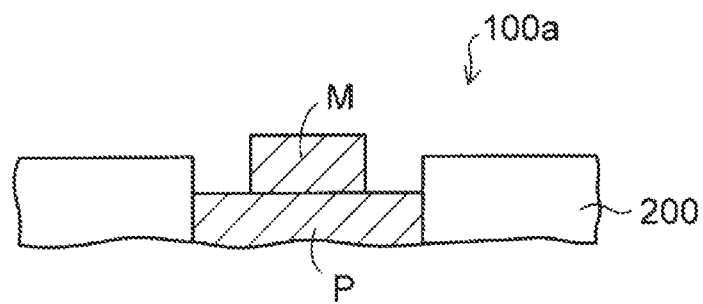
FIGS. 2A to 2C are sectional views for describing a problem of a wiring board according to a preliminary matter (part 2)

In order to solve the problem caused by the sinking of the pad P in the wiring board 100, a wiring board 100a having a structure in which a metal post M is formed additionally on a pad P is shown in FIG. 2A.

Figure 2B:
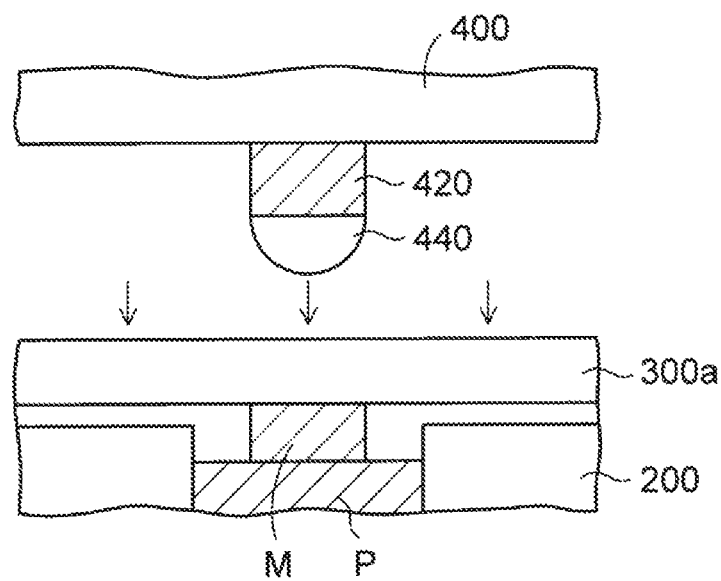

As shown in FIG. 2B, a sealing resin material 300a is disposed on the wiring board 100a and a bump electrode 420 of a semiconductor chip 400 is pushed into the sealing resin material 300a in a similar manner to that in the aforementioned FIG. 1B.

Figure 2C:
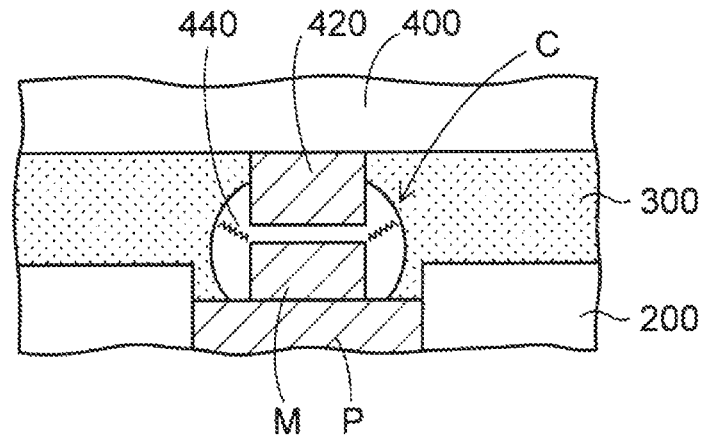

Further, as shown in FIG. 2C, by reflow heating, the bump electrode 420 of the semiconductor chip 400 is flip-chip connected to the pad P of the wiring board 100a through a solder 440. When thermal stress etc. occurs on this occasion, stress is concentrated on upper end corner portions of the metal post M so that cracks C occur easily in the solder 440.

In addition, adhesion properties of the solder 440 to the metal post M and the pad P are not satisfactory. Therefore, improvement of bond strength is required.

Even when the wiring board 100a in FIG. 2A is used thus, there is still a problem that it is impossible to obtain satisfactory reliability in connection between the bump electrode 420 of the semiconductor chip 400 and the pad P of the wiring board 100a.

The aforementioned problems can be solved by use of any of wiring boards according to undermentioned embodiments.

Embodiment

Figure 12:
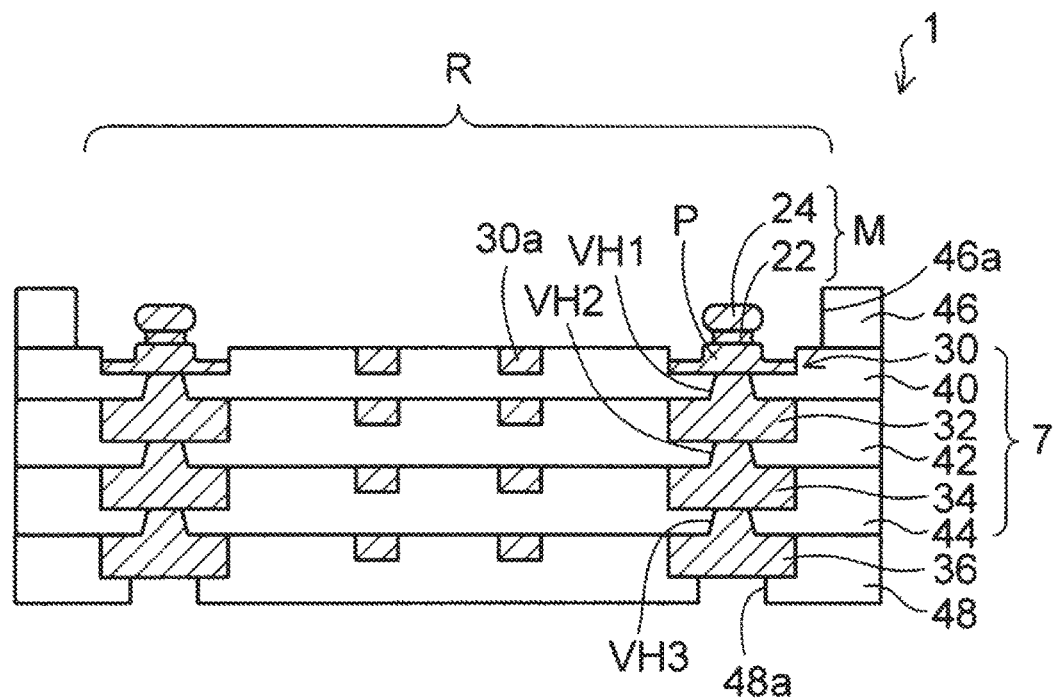
FIG. 12 is a sectional view showing the wiring board according to the embodiment.
Figure 12:
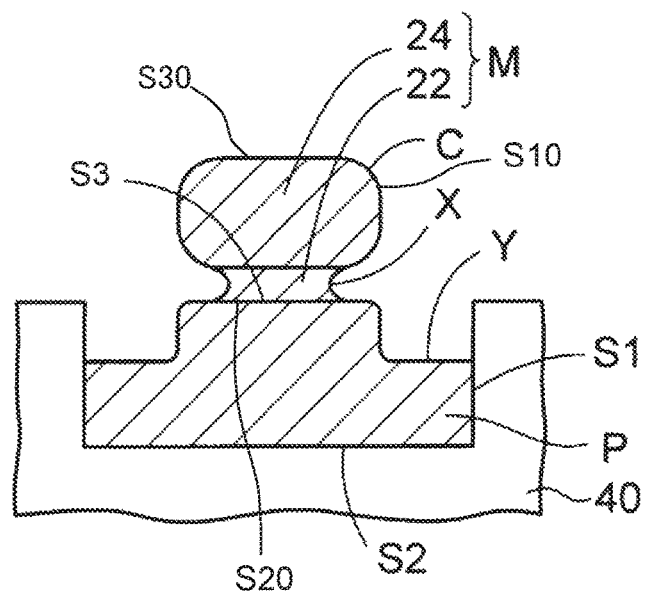
Figure 14A:
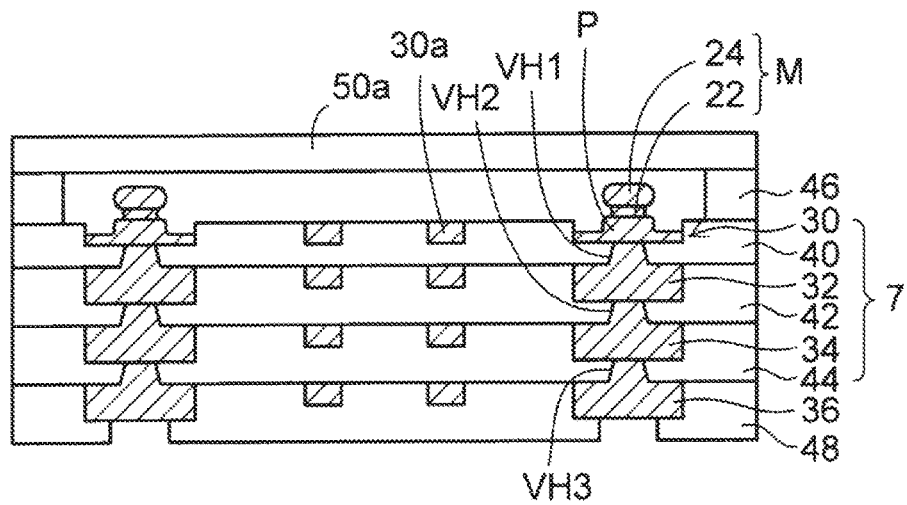
FIGS. 14A and 14B are sectional views showing a method for manufacturing an electronic component device according to the embodiment.
Figure 14B:
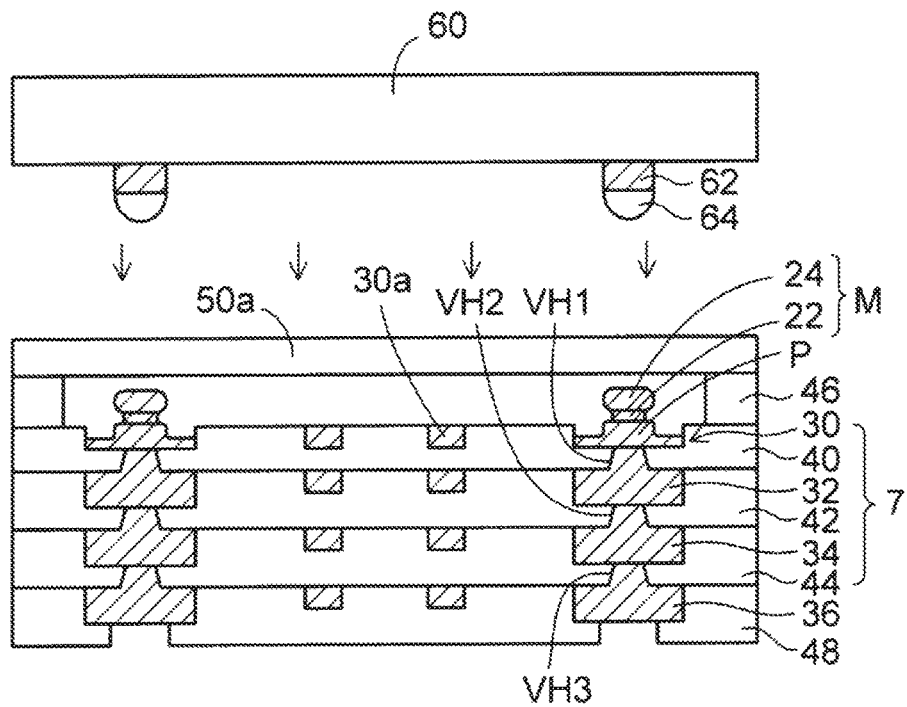
Figure 15:
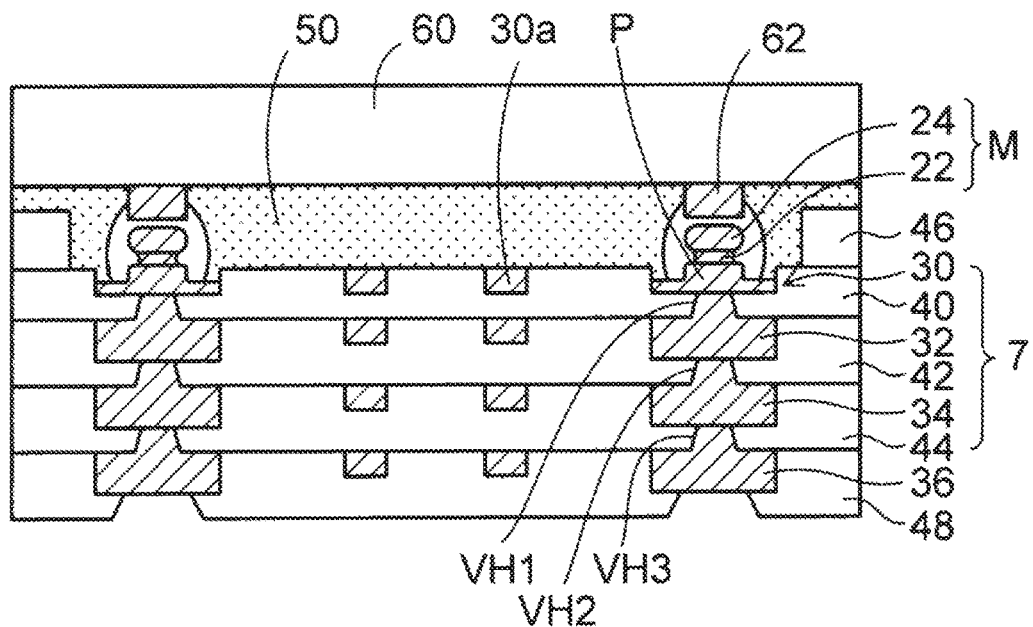
FIG. 15 is a sectional view showing the electronic component device according to the embodiment.
Figure 15:
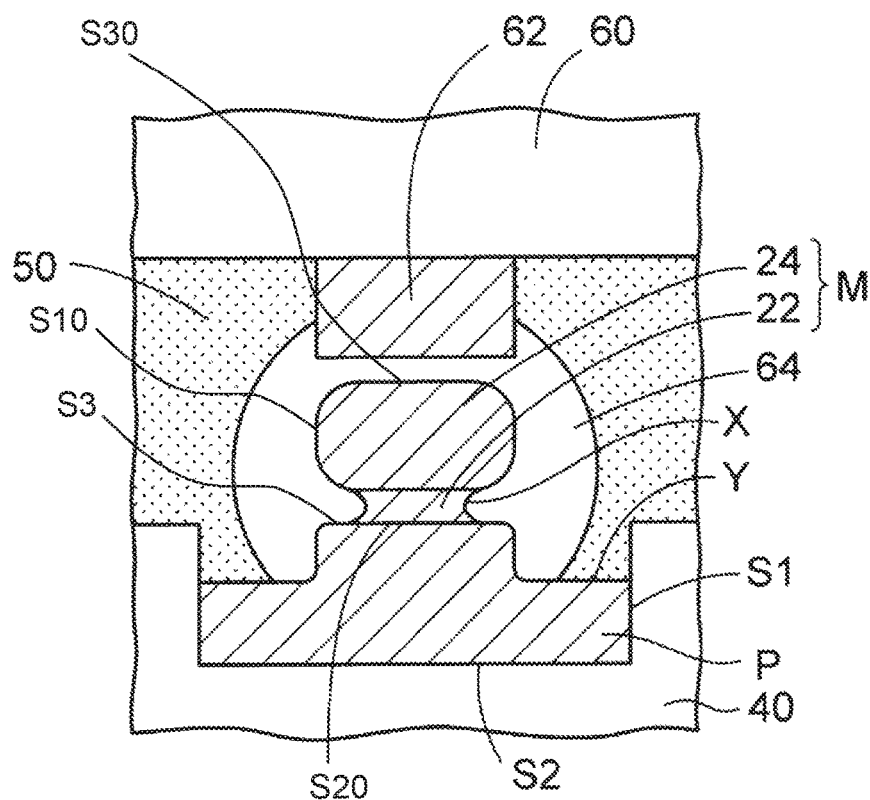

FIGS. 3A to 3D, FIGS. 4A to 4C, FIGS. 5A and 5B, FIGS. 6A and 6B, FIGS. 7A and 7B, FIGS. 8A to 8C, FIG. 9, FIGS. 10A to 10D and FIG. 1 are views for explaining a method for manufacturing a wiring board according to an embodiment. FIG. 12 and FIG. 3 are views showing the wiring board according to the embodiment. FIGS. 14A and 14B and FIG. 15 are views for explaining an electronic component device according to the embodiment.

Description will be made below on the structure of the wiring board and the structure of the electronic component device while description is made on the method for manufacturing the wiring board and the electronic component device.

Figure 3A:
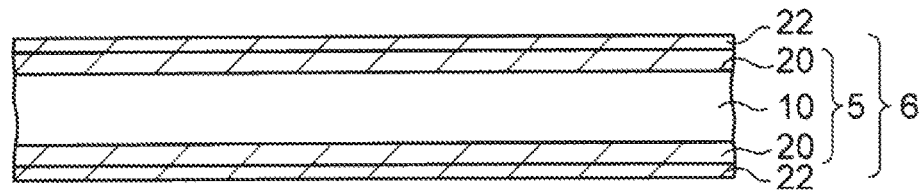
FIGS. 3A to 3D are sectional views showing a method for manufacturing a wiring board according to an embodiment (part 1)

In the method for manufacturing the wiring board according to the embodiment, first, a layered substrate 6 shown in FIG. 3A is prepared. The layered substrate 6 is provided with a temporary substrate 5 which is made up of a base 10 and first copper foils 20 bonded to opposite surfaces of the base 10. Second copper foils 22 are removably formed respectively on the opposite surface sides of the temporary substrate 5.

The base 10 may be formed of prepreg, which is, for example, a composite material formed by impregnating reinforcing fiber such as glass fiber, carbon fiber or aramid fiber in woven or unwoven fabric with a resin such as an epoxy resin or a polyimide resin.

For example, the thickness of the base 10 of the temporary substrate 5 is 50 μm to 500 μm. The thickness of each first copper foil 20 is 12 μm to 70 μm. In addition, the thickness of each second copper foil 22 is 2 μm to 3 μm.

A release agent (not shown) is formed between the first copper foil 20 of the temporary substrate 5 and the second copper foil 22 so that the second copper foil 22 can be released easily from the first copper foil 20 of the temporary substrate 5 at an interface between the both. A silicon-based release agent, a fluorine-based release agent, or a release agent in which particles including a metal component are mixed into components of these release agents, etc. is used as the release agent.

In this manner, the temporary substrate in which the metal foils are formed releasably as the outermost layers is prepared. As long as the metal foils are formed releasably on the temporary substrate, various structures may be used as the layer structure of the temporary substrate under the metal foils.

Figure 3B:
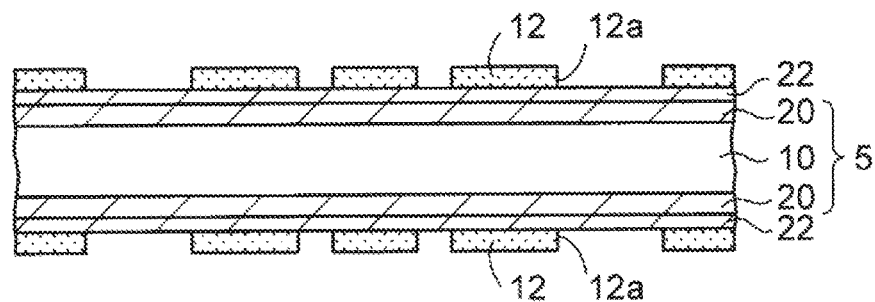

Next, as shown in FIG. 3B, plating resist layers 12 provided with opening portions 12a in regions where first wiring layers should be disposed are formed respectively on the second copper foils 22 formed on the opposite surfaces of the temporary substrate 5. Each of the plating resist layers 12 is formed by pasting a photosensitive dry film resist layer and then applying exposure and development to the photosensitive dry film resist layer based on photolithography. Alternatively, a photosensitive liquid resist may be applied as the plating resist layer 12.

Figure 3C:
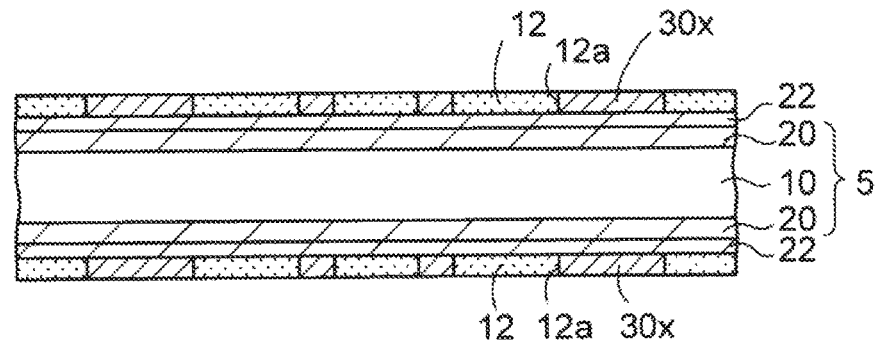

As shown in FIG. 3C, metal plating layers 30x made of copper etc. are further formed respectively in the opening portions 12a of the plating resist layers 12 on the opposite surface sides of the temporary substrate 5 by electrolytic plating using the second copper foils 22 as plating power feed passages.

Figure 3D:
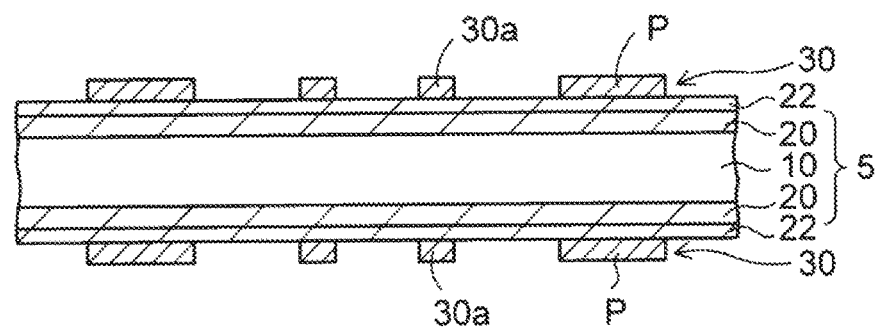

Next, as shown in FIG. 3D, the plating resist layers 12 are removed. Thus, first wiring layers 30 are formed from the metal plating layers 30x. The thickness of each first wiring layer 30 is, for example, about 15 μm.

When a wiring layer is formed by a general semi-additive method, there is a step of etching a seed layer using a copper plating layer as a mask. Since an etching rate of the seed layer is higher than that of the copper plating layer, the seed layer is apt to be formed into an undercut shape in which the seed layer is encroached inward.

According to the embodiment, the first wiring layers 30 are formed only from the metal plating layers 30x and the step of etching seed layers is absent. Therefore, undercutting can be prevented from occurring in base portions of the first wiring layers 30.

Therefore, even when first wiring layers 30 which are fine to have a line (width) of 2 μm to 10 μm and a space (interval) of 2 μm to 10 μm are formed, the first wiring layers 30 can be formed with high reliability without missing any pattern etc.

Each of the first wiring layers 30 is formed to include pads P and wiring portions 30a. As will be described later, a semiconductor chip can be flip-chip connected to lower surfaces of the pads P of the first wiring layer 30. Each pad P of the first wiring layer 30 may be connected to one end of a leading-out wiring or may be disposed like an island.

Figure 4A:
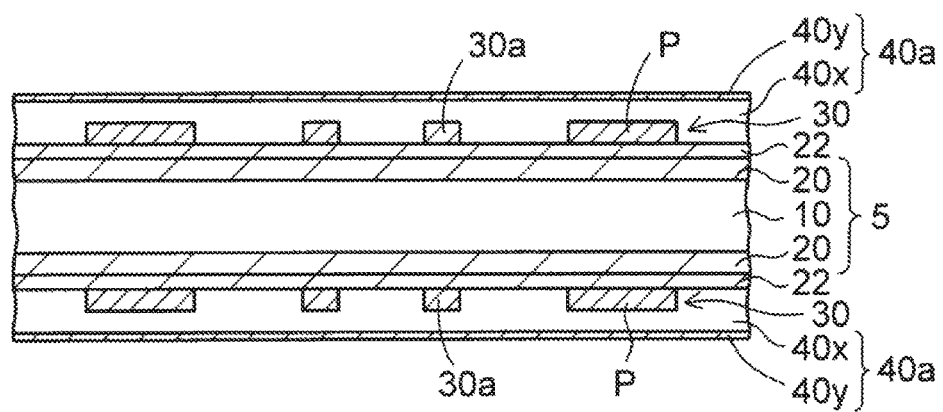
FIGS. 4A to 4C are sectional views showing the method for manufacturing the wiring board according to the embodiment (part 2)

Next, as shown in FIG. 4A, foil-including prepregs 40a are prepared. In each of the copper foil-including prepregs 40a, a copper foil 40y is formed on one surface of a prepreg 40x. For example, woven or nonwoven fabric having reinforcing fiber such as glass fiber, carbon fiber or aramid fiber impregnated with a resin such as an epoxy resin or a polyimide resin may be used as the prepreg 40x.

For example, the thickness of the prepreg 40x is about 60 μm. The thickness of the copper foil 40y is 12 μm to 18 μm.

In the opposite surface sides of the temporary substrate 5, surfaces of the prepregs 40x of the copper foil-including prepregs 40a are pasted on the second copper foils 22 and the first wiring layers 30.

Further, the prepregs 40x are cured by heat treatment so that first insulating layers 40 are obtained. Thus, the first wiring layers 30 on the opposite surface sides of the temporary substrate 5 are embedded in the first insulating layers 40.

Figure 4B:
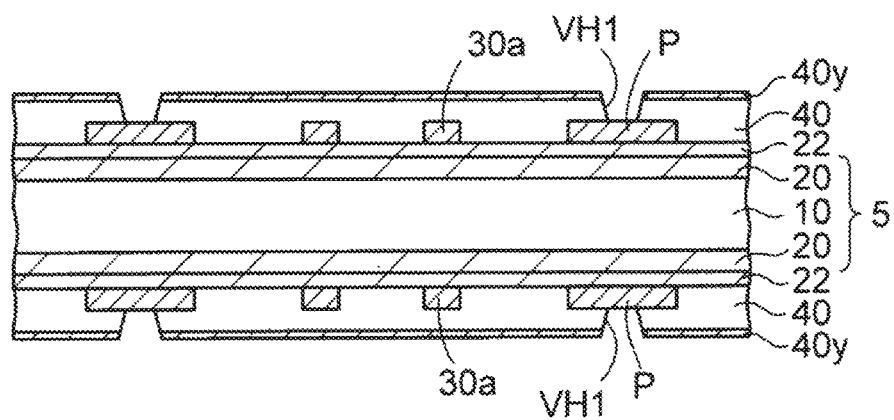

Successively, as shown in FIG. 4B, the copper foils 40y and the first insulating layers 40 are processed by a laser so that first via holes VH1 reaching connection portions of the first wiring layers 30 can be formed in the opposite surface sides of the temporary substrate 5 respectively. Each of the first via holes VH1 is formed into a forward tapered shape whose diameter is smaller as the distance to the pad P decreases.

Figure 4C:
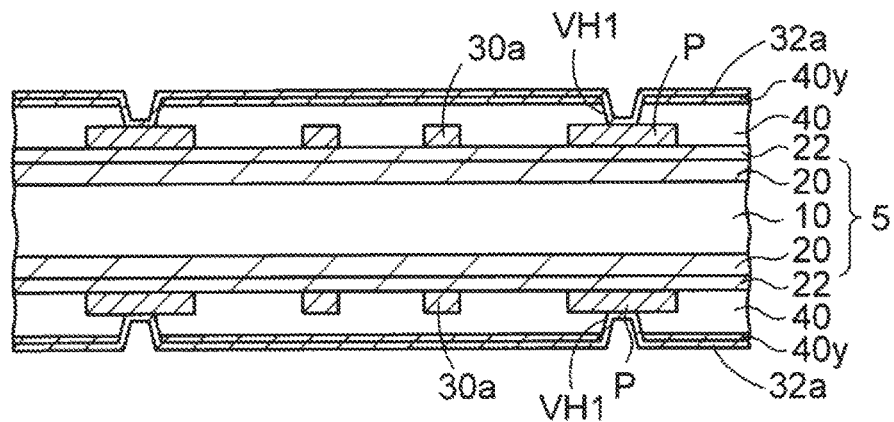

Next, as shown in FIG. 4C, seed layers 32a made of copper etc. are formed on the copper foils 40y and inside the first via holes VH1 on the opposite surface sides of the temporary substrate 5 by an electroless plating or sputtering method.

Figure 5A:
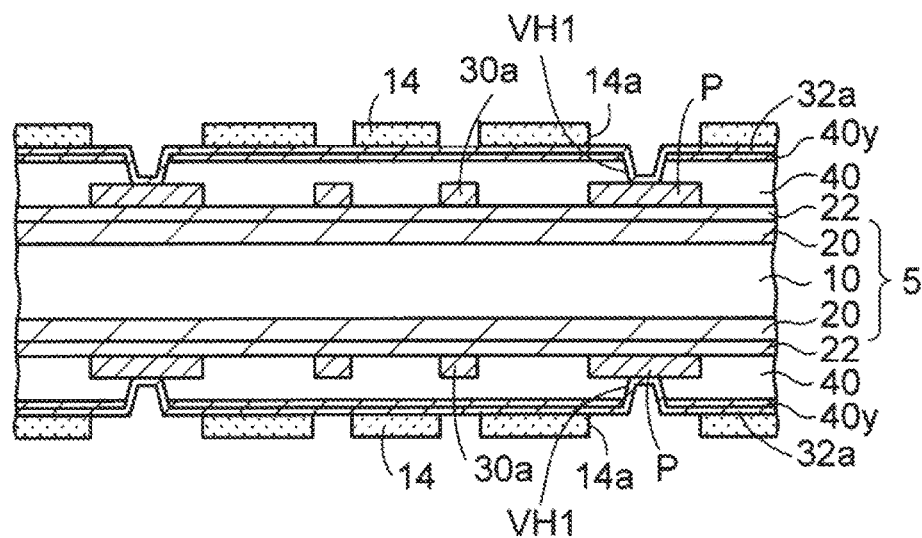
FIGS. 5A and 5B are sectional views showing the method for manufacturing the wiring board according to the embodiment (part 3)

Successively, as shown in FIG. 5A, plating resist layers 14 including opening portions 14a provided in regions where second wiring layers should be disposed are formed on the seed layers 32a on the opposite surface sides by a similar method to that in the aforementioned step of FIG. 3B.

Figure 5B:
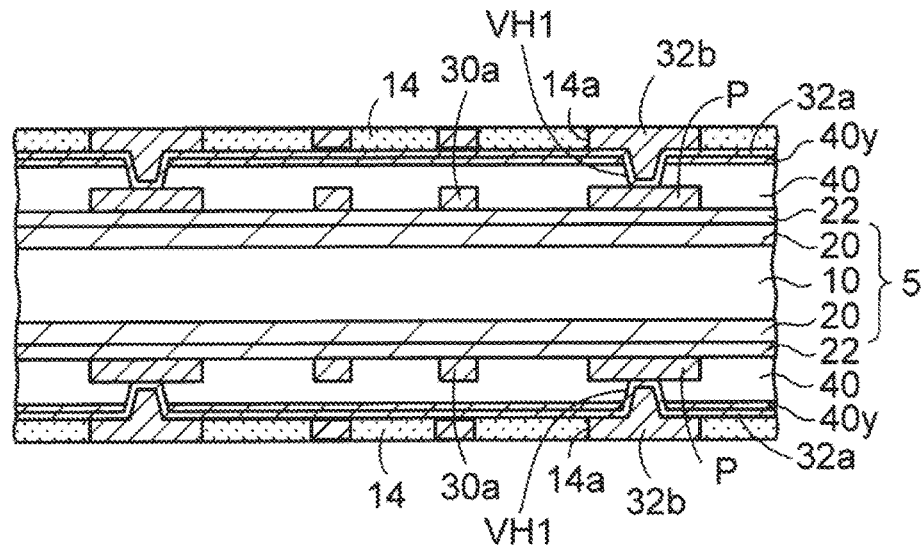

Further, as shown in FIG. 5B, metal plating layers 32b made of copper etc. are formed to extend from the inside of the first via holes VH1 to the opening portions 14a of the plating resist layers 14 by electrolytic plating which uses the seed layers 32a as plating power feed passages.

Figure 6A:
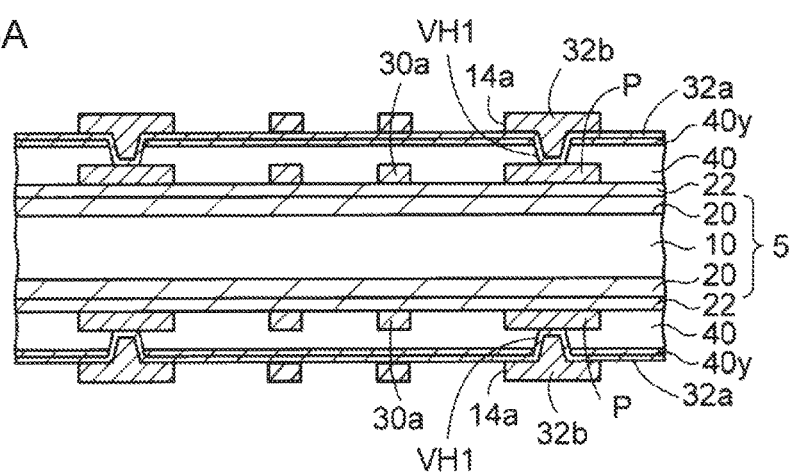
FIGS. 6A and 6B are sectional views showing the method for manufacturing the wiring board according to the embodiment (part 4)
Figure 6A:
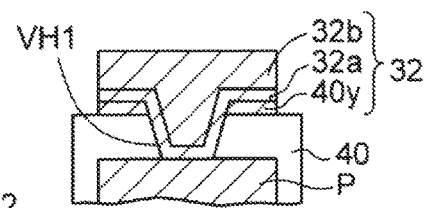

Successively, as shown in FIG. 6A, the plating resist layers 14 are removed. Then, as shown in FIG. 6B, the seed layers 32a and the copper foils 40y are removed by wet etching using the metal plating layers 32b as masks.

Figure 6B:
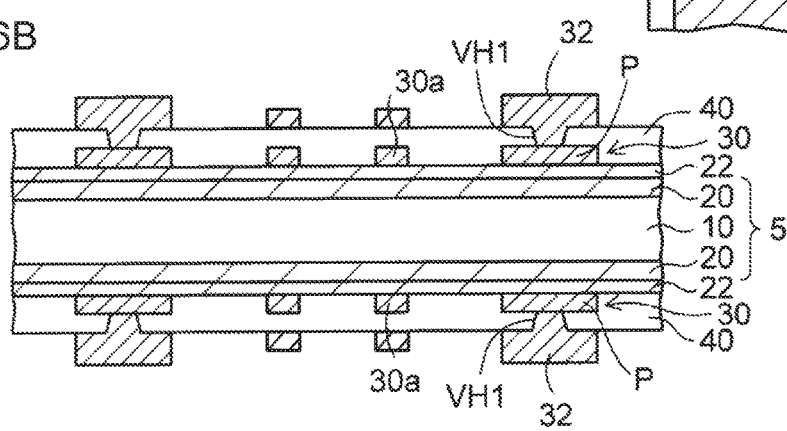

Thus, as shown in a partially enlarged sectional view of FIG. 6B, second wiring layers 32 are formed from the copper coils 40y, the seed layers 32a and the metal plating layers 32b.

Incidentally, in the aforementioned mode, the first insulating layers 40 are formed from the copper foil-including prepregs 40a and the copper foils 40y of the copper foil-including prepregs 40a are used as parts of the second wiring layers 32. When the first insulating layers 40 do not require reinforcing fiber, the first insulating layers 40 may be formed by pasting sheets of a resin such as an epoxy resin or a polyimide resin to which the copper foils 40y have not been bonded.

Figure 7A:
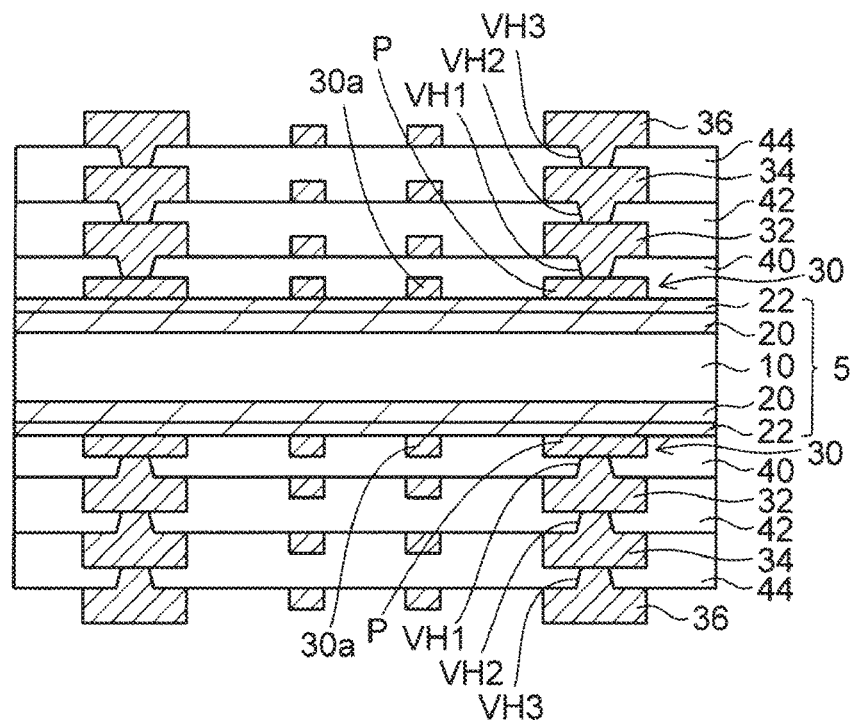
FIGS. 7A and 7B are sectional views showing the method for manufacturing the wiring board according to the embodiment (part 5)

Next, as shown in FIG. 7A, the same steps as the aforementioned steps from FIG. 4A to FIG. 6B are carried out repeatedly twice on the opposite surface sides of the temporary substrate 5.

Thus, second insulating layers 42 in which second via holes VH2 reaching connection portions of the second wiring layers 32 are disposed are formed on the first insulating layers 40 on the opposite surface sides respectively.

Further, third wiring layers 34 are formed on the second insulating layers 42 on the opposite surface sides respectively so that the third wiring layers 34 can be connected to the second wiring layers 32 through via conductors inside the second via holes VH2.

In addition, third insulating layers 44 in which third via holes VH3 reaching connection portions of the third wiring layers 34 are disposed are formed on the second insulating layers 42 on the opposite surface sides respectively.

Further, fourth wiring layers 36 are formed on the third insulating layers 44 on the opposite surface sides respectively so that the fourth wiring layers 36 can be connected to the third wiring layers 34 through via conductors inside the third via holes VH3.

Each of the third and fourth wiring layers 34 and 36 is formed to have the same layer structure as the second wiring layer 32 shown in the aforementioned partially enlarged sectional view of FIG. 6B.

As described above, four multiple wiring layers having the pads P in the bottom are formed on each of the second copper foils 22 formed on the opposite surfaces of the temporary substrate 5. The number of deposition of the multiple wiring layers formed on each of the opposite surface sides of the temporary substrate 5 can be set arbitrarily.

Figure 7B:
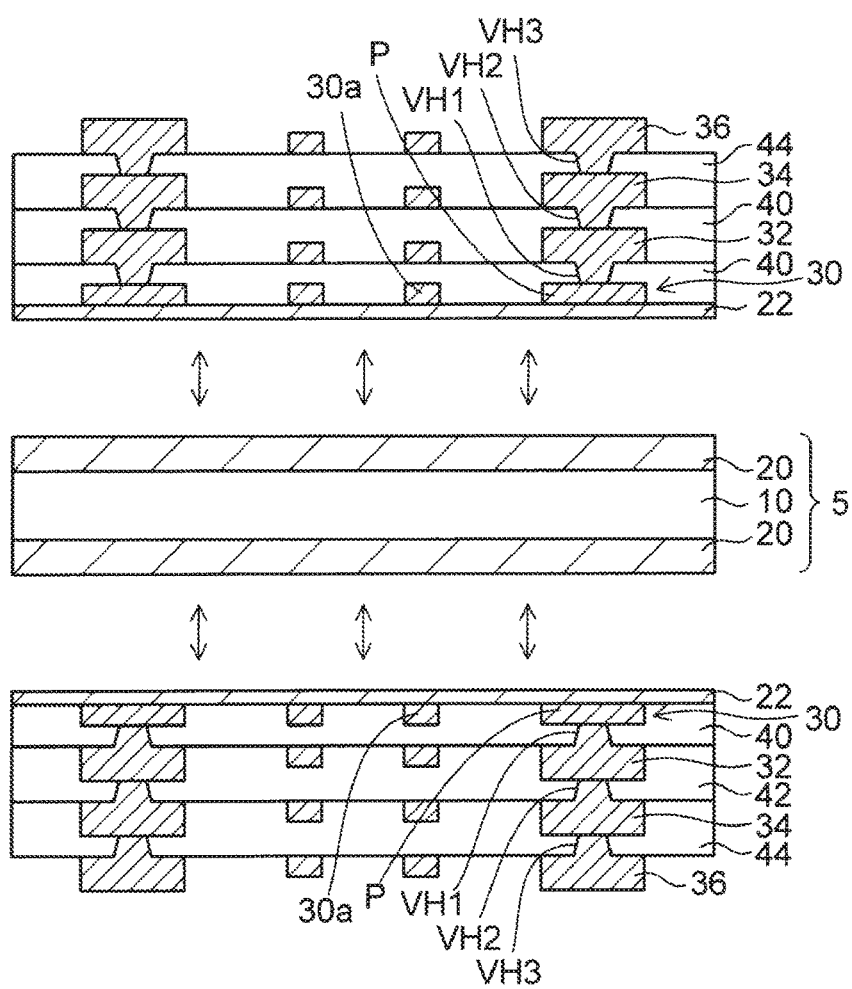

Successively, as shown in FIG. 7B, the temporary substrate 5 is released from the interfaces with the second copper foils 22 to be separated from the second copper foils 22 on the opposite surface sides of the temporary substrate 5.

Figure 8A:
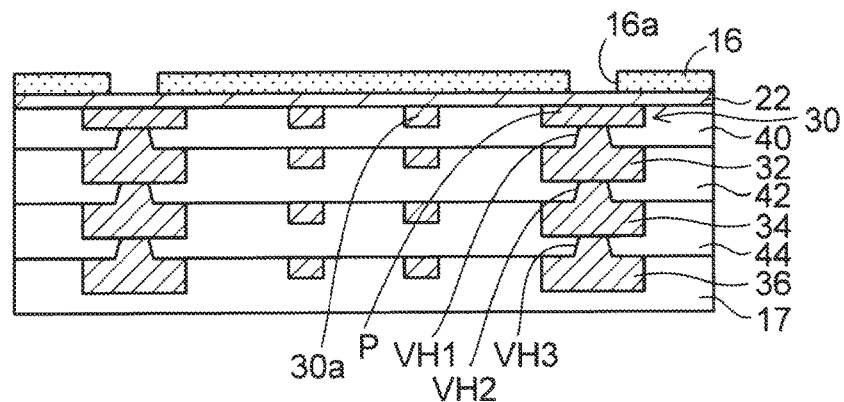
FIGS. 8A to 8C are sectional views showing the method for manufacturing the wiring board according to the embodiment (part 6)

Successively, as shown in FIG. 8A, a plating resist layer 16 in which opening portions 16a are disposed on the pads P of the first wiring layer 30 is formed on the second copper foil 22 of the wiring material in FIG. 7B separated from the temporary substrate 5. Further, a protective sheet 17 protecting the fourth wiring layer 36 is pasted on the third insulating layer 44 on the lower surface side. The same layer as the plating resist layer 16 may be used as the protective sheet 17.

Figure 8B:
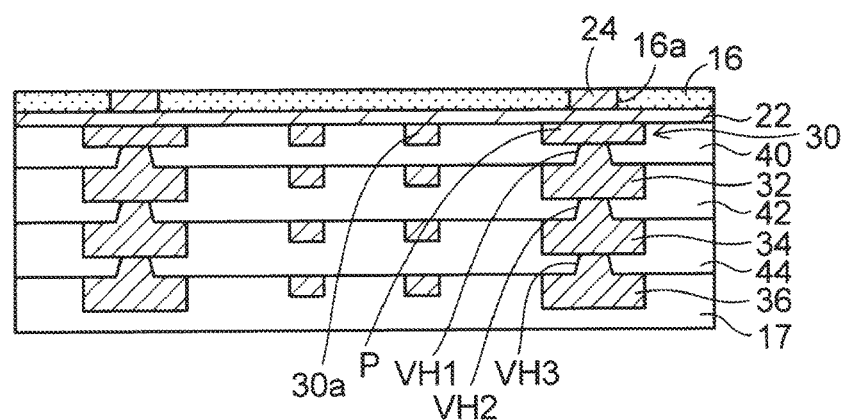

Next, as shown in FIG. 8B, columnar metal plating portions 24 made of copper are formed in the opening portions 16a of the plating resist layer 16 are formed by electrolytic plating using the second copper foil 22 as a plating power feed passage.

Figure 8C:
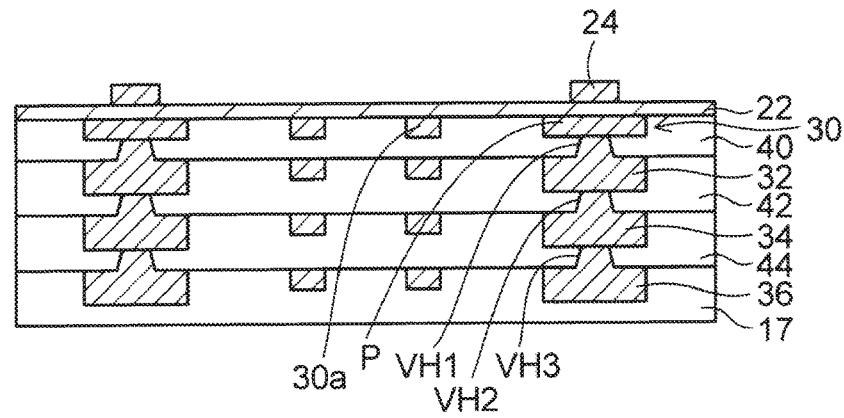

Then, as shown in FIG. 8C, the plating resist layer 16 is removed. Thus, the columnar metal plating portions 24 are disposed inside regions of the second copper foil 22 corresponding to the pads P of the first wiring layer 30. The area of each metal plating portion 24 is set to be smaller than the area of each pad P in a top view and the metal plating portion 24 is disposed in a central portion of the region on the pad P.

When the same layer as the plating resist layer 16 is used as the protective sheet 17 on this occasion, the protective sheet 17 is removed simultaneously with the plating resist layer 16.

Figure 9:
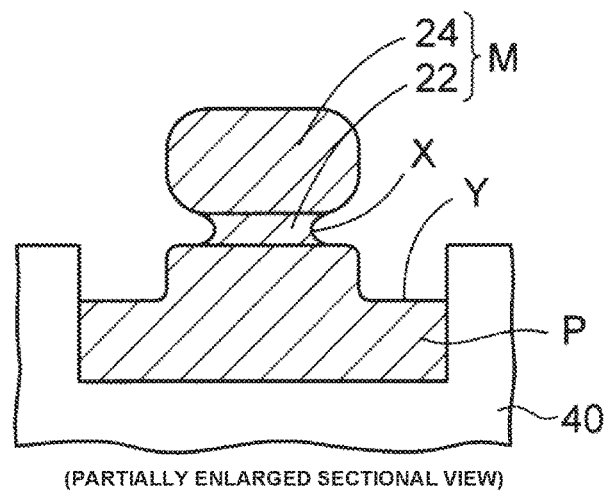
FIG. 9 is a sectional view showing the method for manufacturing the wiring board according to the embodiment (part 7)
Figure 9:
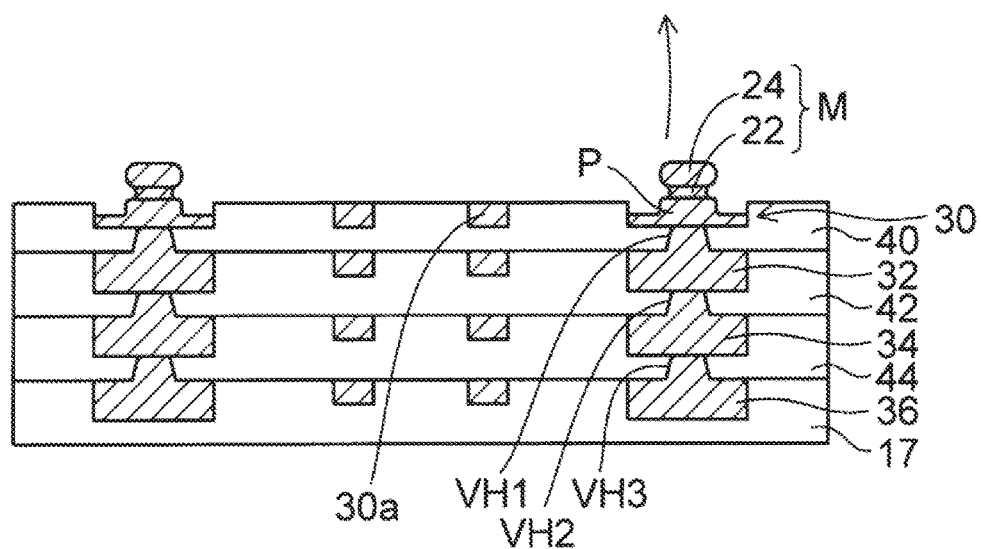

Next, as shown in FIG. 9, the second copper foil 22 is wet-etched by a mixture solution of sulfuric acid and hydrogen peroxide water using each metal plating portion 24 as a mask.

On this occasion, an etching rate of the second copper foil 22 is characterized to be higher than an etching rate of the metal plating portion 24 (copper). When the metal plating layer and the copper foil are formed on the whole surface of the board and etching rates of the metal plating layer and the copper foil using the mixture solution of sulfuric acid and hydrogen peroxide water are measured respectively, the etching rate of the copper foil is about 1.5 times as high as the etching rate of the metal plating layer.

Therefore, when the second copper foil 22 is wet-etched using the metal plating portion 24 as the mask as shown in the partially enlarged sectional view of FIG. 9, the side surface of the second copper foil 22 is positioned to be retreated inward from the side surface of the metal plating portion 24.

Further, when predetermined over-etching is performed after completion of the etching of the second copper foil 22, the portion of the pad P around the metal plating portion 24 is etched so that a ring-like recess Y is formed.

The metal plating portion 24 and the pad P are formed from the same electrolytic copper plating layer. Accordingly, etching rates of the metal plating portion 24 and the pad P using the mixture solution of sulfuric acid and hydrogen peroxide water are substantially the same.

As described above, the second copper foil 22 which is retreated inward is disposed between the metal plating portion 24 and the pad P so that a narrowed portion X can be formed. A metal post M is made up of the second copper foil 22 and the metal plating portion 24.

In this manner, the metal post M having the narrowed portion X at its base rooted in the pad P is formed on the pad P.

Incidentally, when the same layer as the plating resist layer 16 is used as the protective sheet 17 in the aforementioned step of FIG. 8A, the fourth wiring layer 36 is exposed in the step of forming the metal post M. However, since the fourth wiring layer 36 does not have a fine pattern, there is no problem even if the fourth wiring layer 36 is etched slightly in the step of forming the metal post M.

Figure 10A:
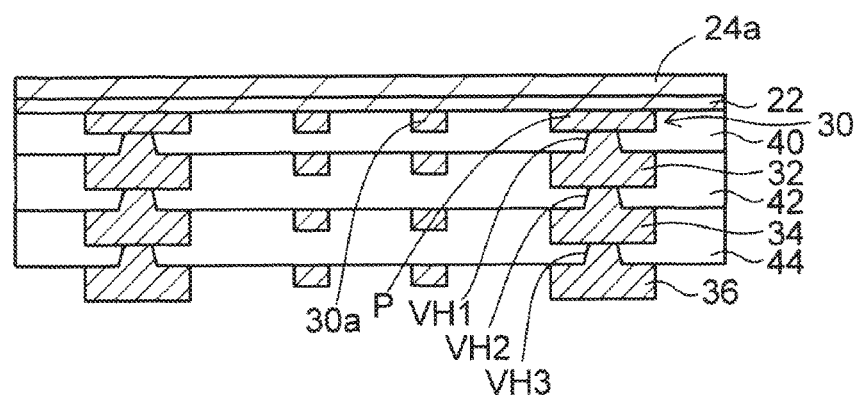
FIGS. 10A to 10D are sectional views showing the method for manufacturing the wiring board according to the embodiment (part 8)

Another method for forming the metal posts M will be shown in FIGS. 10A to 10D. As shown in FIG. 10A, first, a metal plating layer 24a made of copper is formed, by electrolytic plating, into a blanket shape and on the whole surface on the second copper foil 22 of the wiring material separated from the aforementioned temporary substrate 5 shown in FIG. 7B.

Figure 10B:
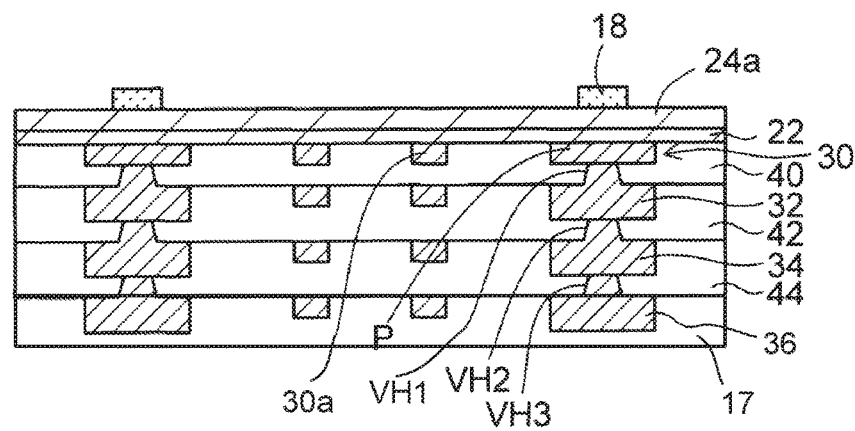

Next, as shown in FIG. 10B, a pattern of a resist layer 18 is formed on the metal plating layer 24a based on photolithography in portions where metal posts M should be disposed. Further, the protective sheet 17 protecting the fourth wiring layer 36 is pasted on the third insulating layer 44 on the lower surface side. The same layer as the plating resist layer 18 can be used as the protective sheet 17.

Figure 10C:
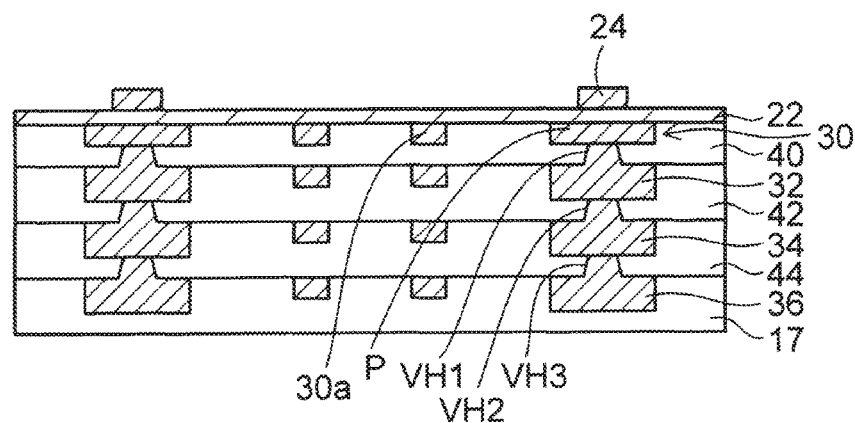

Successively, as shown in FIG. 10C, the metal plating layer 24a is wet-etched by the mixture solution of sulfuric acid and hydrogen peroxide water using the resist layer 18 as a mask. Thus, metal plating portions 24 are obtained. On this occasion, the metal plating layer 24a may remain in some degree or the second copper foil 22 may be etched slightly.

In the case where there is a concern that peeling of the resist layer 18 may occur during etching by the mixture solution of sulfuric acid and hydrogen peroxide water, for example, an alkali-based etchant may be used alternatively in this step. Then, the resist layer 18 is removed.

Next, the second copper foil wet-etched by the mixture solution of sulfuric acid and hydrogen peroxide water using each of the exposed metal plating portions 24 as a mask.

Figure 10D:
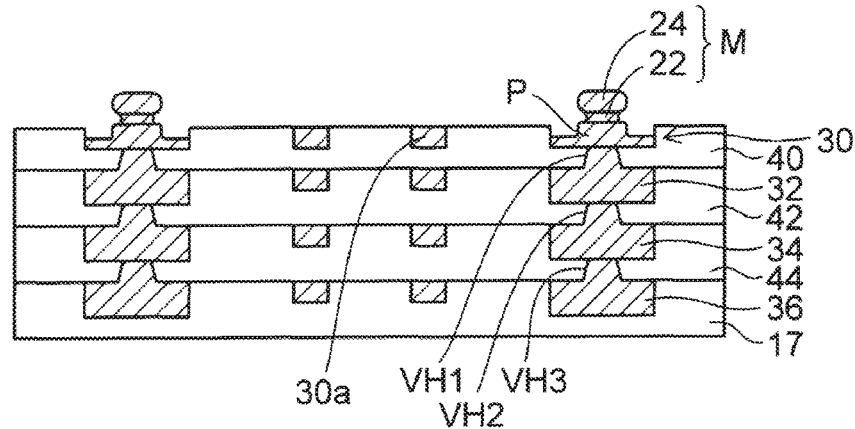

Thus, as shown in FIG. 10D, metal posts M having the same structure as the aforementioned metal posts M in FIG. 9 are formed on the pads P.

Figure 11:
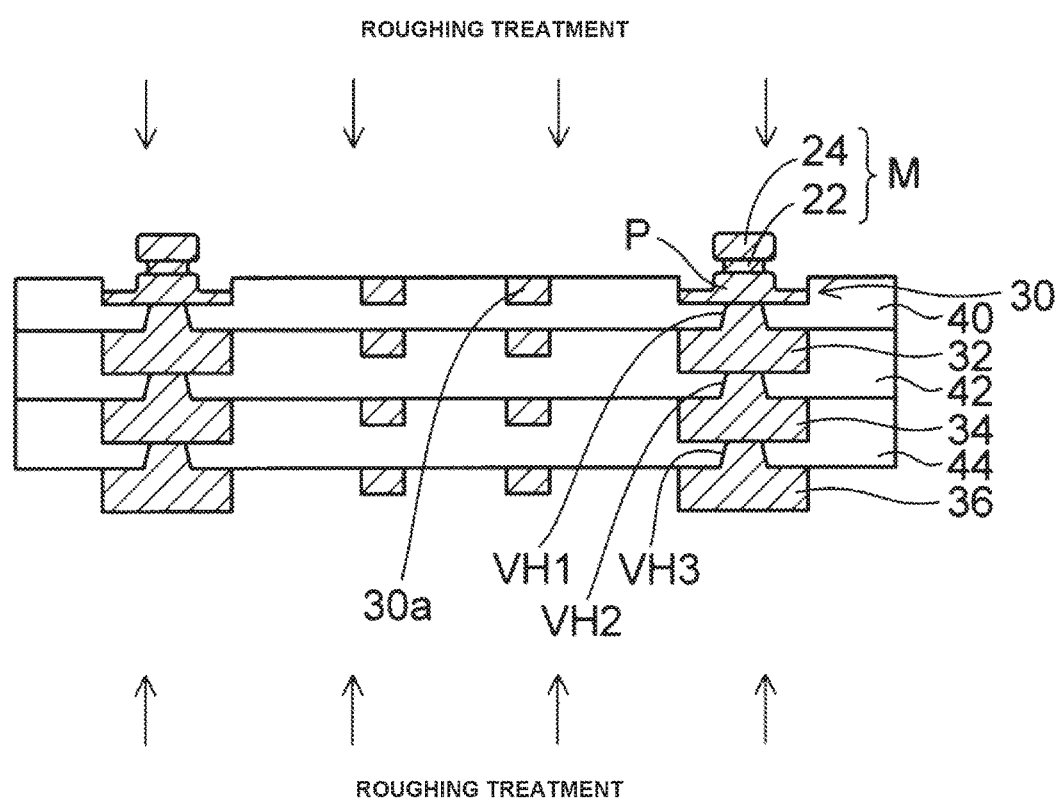
FIG. 11 is a sectional view showing the method for manufacturing the wiring board according to the embodiment (part 9)

Next, return to description about the method for manufacturing the wiring board after the metal posts M have been formed. As shown in FIG. 11, the protective sheet 17 on the lower surface side of the aforementioned wiring member shown in FIG. 9 is released and removed. Further, a roughing treatment liquid made of a formic acid-based aqueous solution is sprayed onto the opposite surface sides of the wiring member so that roughing treatment can be applied thereto.

Thus, the surface of the first wiring layer 30 including the pads P and the metal posts M on the upper surface side and the surface of the fourth wiring layer 36 on the lower surface side are roughened.

Next, as shown in FIG. 12, a solder resist layer 46 provided with an opening portion 46a collectively exposing a plurality of pads P and metal posts M in a component mounting region R is formed on the first insulating layer 40 on the upper surface side of the wiring member shown in FIG. 11.

Further, a solder resist layer 48 in which opening portions 48 are provided on the connection portions of the fourth wiring layer 36 is formed under the third insulating layer 44 on the lower surface side of the wiring member shown in FIG. 11. The solder resist layers 46 and 48 on the opposite surface sides are made of an epoxy-based or acrylic-based insulating resin.

In the aforementioned manner, a wiring board 1 according to the embodiment can be obtained as shown in FIG. 12.

As shown in FIG. 12, the wiring board 1 according to the embodiment is a coreless board which has no core board and in which an insulating base material 7 is made up of the first insulating layer 40, the second insulating layer 42, and the third insulating layer 44. The first wiring layer 30 is embedded in the first insulating layer 40. The pads P and the wiring portions 30a of the first wiring layer 30 are shown in FIG. 12.

The pad P includes an upper surface S3, a lower surface S2 opposite to the upper surface S3, and a side surface S1 between the upper surface S3 and the lower surface S2.

The first via holes VH1 reaching the lower surfaces S2 of the pads P are formed in the first insulating layer 40. Further, the second wiring layer 32 are formed under the first insulating layer 40 so that the second wiring layer 32 can be connected to the pads P through the via conductors inside the first via holes VH1.

In addition, the second insulating layer 42 provided with the second via holes VH2 reaching the lower surface of the second wiring layer 32 is formed under the first insulating layer 40. Further, the third wiring layer 34 is formed under the second insulating layer 42 so that the third wiring layer 34 can be connected to the second wiring layer 32 through the via conductors inside the second via holes VH2.

In addition, the third insulating layer 44 provided with the third via holes VH3 reaching the lower surface of the third wiring layer 34 is formed under the second insulating layer 42. Further, the fourth wiring layer 36 is formed under the third insulating layer 44 so that the fourth wiring layer 36 can be connected to the third wiring layer 34 through the via conductors inside the third via holes VH3.

In addition, the solder resist layer 48 in which the opening portions 48a are provided on the connection portions of the fourth wiring layer 36 is formed under the third insulating layer 44.

Each of the first via holes VH1 and the via conductors in the first via holes VH1 is disposed in a reverse tampered shape whose diameter increases as the distance from the lower surface of the pad P increases. Each of the second and third via holes VH2 and VH3 is also disposed in a similar reverse tampered shape. It is because the multiple wiring layers formed on the temporary substrate 5 are disposed upside down.

Next, return to description about the periphery of each pad P of the first wiring layer 30. When a partially enlarged sectional view of FIG. 12 is additionally referred to, a side surface S1 and a lower surface S2 of the pad P are embedded in the first insulating layer 40 and the upper surface S3 of the pad P is exposed from the first insulating layer 40.

The metal post M made up of the second copper foil 22 and the metal plating portion 24 is disposed on the upper surface S3 of the pad P. One example of the metal foil is the second copper foil 22. Alternatively, a metal foil made of another metal may be used. The upper surface of the metal post M is higher in height than the upper surface of the first insulating layer 40.

Since the second copper coil 22 is used as apart of the metal post M, the metal post M high in height can be formed even if it does not take a long time to form the metal plating portion 24 by plating deposition. The metal post M includes an upper surface S30, a lower surface S20 opposite to the upper surface S30, and aside surface S10 between the upper surface S30 and the lower surface S20.

The area of the metal post M is set to be smaller than the area of the pad P when viewed from a top. The metal post M is erectly provided in the central portion of the pad P.

The side surface of the second copper foil 22 of the metal post M is disposed to be retreated inward from the side surface of the metal plating portion 24. In this manner, the metal post M is formed and provided with the narrowed portion X at its base rooted in the pad P. The height of the narrowed portion X is 2 μm to 3 μm correspondingly to the thickness of the second copper foil 22. Also, it can be said that the narrowed portion X is formed in the side surface S10 of the metal post M.

In addition, the recess Y is formed into a ring shape in the portion of the pad P around the metal post M. A lower surface of the recess Y of the pad P is lower in height than the upper surface of the first insulating layer 40.

In addition, an upper surface of the pad P is disposed in a position substantially the same in height as the upper surface of the first insulating layer 40. The side surface of the copper foil 22 of the metal post M is retreated inward from an outer circumferential surface of the pad P.

Further, since the second copper foil 22 is wet-etched using the metal plating portion 24 as a mask as described above, each of an upper end edge portion and a lower end edge portion of the metal plating portion 24 is chamfered by wet etching so as to be formed into a curved portion C. In this regard, the upper end edge portion and the lower end edge portion of the metal plating portion 24 are curved.

The diameter of the pad P is in the range of from 10 μm to 200 μm. For example, the diameter of the pad P is set at 44 μm. The height of the metal post M is in the range of from 2 μm to 15 μm. For example, the height of the metal post M is set at 6 μm. In addition, the diameter of the metal post M is in the range of from 5μ to 150 μm. For example, the diameter of the metal post M is set at 21 μm. In addition, the depth of the recess Y of the pad P is in the range of from 1 μm to 10 μm. For example, the depth of the recess Y of the pad P is set at 4 μm.

In addition, in the aforementioned step of roughing treatment in FIG. 11, the surface of the first wiring layer 30 including the pads P and the metal posts M are roughened and the roughness (Ra) of the surface is in the range of from 100 nm to 500 nm. For example, the roughness (Ra) of the surface is set at 300 nm. In this manner, the solder resist layer 46 is formed on the first wiring layer 30 with excellent adhesion properties due to an anchor effect.

In addition, since the surface of the fourth wiring layer 36 on the lower surface side is also roughened similarly, the solder resist layer 48 is formed on the fourth wiring layer 36 with excellent adhesion properties due to an anchor effect.

Incidentally, although the via conductors inside the first via holes VH1 are connected to the back surfaces of the pads P in the example of FIG. 12, there may be a case were the via conductors are not connected to the back surfaces of the pads P. In this case, pad receiving vias may be provided in advance in the connection portions 30a of the first wiring layer 30 so that the via conductors can be connected to the pad receiving vias.

Figure 13:
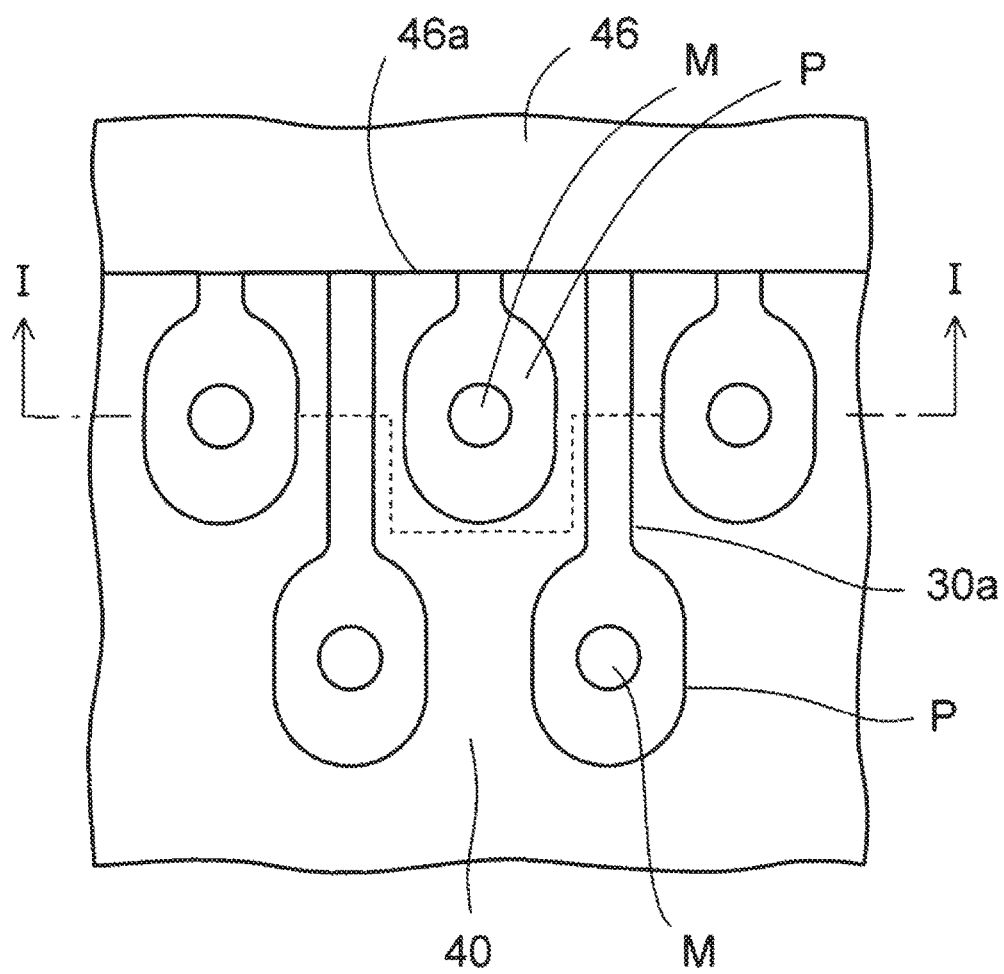
FIG. 13 is a partial plan view in which the wiring board in FIG. 12 is observed from above.

FIG. 13 is a partial plan view in which the layout of the pads P and the metal posts M in FIG. 12 is observed from above. A sectional view of the first wiring layer 30 and its periphery in a component mounting region R in FIG. 12 corresponds to a section taken along a line I-I in FIG. 13.

As shown in FIG. 13, a plurality of wiring portions 30a in the first wiring layer 30 are arranged side by side horizontally. The pads P are disposed on one ends of the wiring portions 30a respectively. The metal posts M are formed in the central portions of the pads P respectively. The opening portion 46a of the solder resist layer 46 is opened so that the pads P and the metal posts M can be exposed collectively in the opening portion 46a of the solder resist layer 46.

Each of the wiring portions 30a extends toward the center side between adjacent ones of the pads P arranged side by side on an inner circumferential edge side of the opening portion 46a of the solder resist layer 46. In order to increase the arrangement density of the pads P, the pads P are disposed zigzag in an alternate manner so that pads P of one array can be arranged in positions displaced from pads P of the other array by half the pitch between adjacent ones of the pads P of the other array.

In the example of FIG. 13, one opening portion 46a is formed in a lump in the solder resist layer 46 so as to expose a plurality of pads P and a plurality of metal posts M collectively. Alternatively, the opening portion of the solder resist layer may be divided into parts and disposed so that the divided parts of the opening portion can be disposed on the pads P and the metal posts M respectively.

Next, description on an effect of the wiring board according to the embodiment will be made while description is made on a method for flip-chip connecting a semiconductor chip to the wiring board 1 according to the embodiment in FIG. 12.

In the embodiment, a technique for flip-chip connecting a semiconductor chip through a sealing resin material is used.

As shown in FIG. 14A, a sealing resin material 50a is disposed on the wiring substrate 1 in FIG. 12. An epoxy resin etc. may be used as the sealing resin material 50a in the form of a semi-cured (B stage) resin film disposed on the wiring board 1 or in the form of a liquid resin applied to the wiring board 1.

Further, as shown in FIG. 14B, a semiconductor chip 60 is prepared. The semiconductor chip 60 has bump electrodes 62 provided in its lower surface. Solders 64 are formed at front ends of the bump electrodes 62 respectively. The metal posts M on the pads P in the aforementioned wiring board 1 are arrayed correspondingly to the bump electrodes 62 of the semiconductor chip 60 respectively.

As shown in FIG. 14B and FIG. 15, the bump electrodes 62 of the semiconductor chip 60 are pushed into the sealing resin material 50a on the wiring board 1 so that the solders 64 at the front ends of the bump electrodes 62 of the semiconductor chip 60 are pressed against the pads P of the wiring board 1.

Further, the solders 64 at the front ends of the bump electrodes 62 of the semiconductor chip 60 are melted by reflow heating. Thus, the bump electrodes 62 of the semiconductor chip 60 are flip-chip connected to the pads P of the wiring board 1 by the solders 64.

For example, a lead-free solder such as a tin/silver-based solder or a tin/silver/copper-based solder is used as each of the solders 64. The reflow temperature is set at about 260° C.

During the reflow heating, the sealing resin 50a in a semi-cured state is cured simultaneously so that a lower side of the semiconductor chip 60 can be filled with a cured sealing resin 50. The sealing resin 50 is also referred to as underfill resin.

In this manner, an electronic component device 2 according to the embodiment can be obtained. When a multi-chamfered wiring board is used, the wiring board is cut into pieces so that component mounting regions can be obtained in the pieces of the wiring board respectively. Thus, individual electronic component devices can be obtained.

Although the semiconductor chip 60 provided with the bump electrodes 62 is illustrated as an electronic component provided with terminals by way of example, various electronic components provided with similar terminals, such as a semiconductor module component, a capacitor element, an inductor element or a resistance element may be used.

As described above, the metal posts M are disposed on the pads P whose side surfaces S1 and lower surfaces S2 are embedded in the first insulating layer 40 and the upper surfaces of the metal posts M are used as connection portions in the wiring board 1 according to the embodiment. Thus, the connection portions of the metal posts M are disposed in positions higher than the upper surface of the first insulating layer 40.

In addition, the metal posts M of the wiring board 1 are disposed in the central portions of the pads P. The area of each metal post M is set to be smaller than the area of each pad P.

The bump electrodes 62 of the semiconductor chip 60 are flip-chip connected to the metal posts M of the wiring board 1 through the sealing resin material 50a.

On this occasion, the sealing resin material 50a on the metal posts M of the wiring board 1 is pressed by the bump electrodes 62 of the semiconductor chip 60 so that the sealing resin material 50a can flow to the outside. The metal posts M are disposed in positions higher than the upper surface of the first insulating layer 40 and the upper end edge portions of the metal posts M serve as the chamfered curved portions C. Further, the regions on the pads P around the metal posts M are made into spaces, and there are no barriers around the metal posts M.

Since such a structure is used, the sealing resin material 50a on the metal posts M of the wiring board 1 can be discharged smoothly to the outside when the semiconductor chip 60 is flip-chip connected. This is also because the area of each metal post M of the wiring board 1 is set to be smaller than the area of each pad P in a top view so that the volume of the sealing resin material 50a to be discharged can be reduced.

In this manner, a residue of the sealing resin material 50a can be prevented from occurring between the metal posts M of the wiring board 1 and the bump electrodes 62 of the semiconductor chip 60.

In addition, when the semiconductor chip 60 is flip-chip connected to the wiring board 1, when the electronic component device 2 is connected to a mount board, or when the electronic component device 2 is really used, thermal stress occurs due to a difference in thermal expansion coefficient between the respective elements.

In the wiring board 1 according to the embodiment, the upper end edge portions of the metal posts M serve as the chamfered curved portions C. Therefore, stress concentration on the upper end edge portions of the metal posts M can be relaxed even if the thermal stress etc. occurs. Thus, cracks can be prevented from occurring in the solders 64 at the upper end edge portions of the metal posts M of the wiring board 1. Accordingly, high reliability can be secured from the time when the wiring board 1 is manufactured to the time when the wiring board 1 is in use.

In addition, the metal posts M include the narrowed portions X provided at their bases rooted in the pads P. Therefore, the contact area of each solder 64 is large and the adhesion properties of the solder 64 can be improved due to an anchor effect. Accordingly, it is possible to improve bond strength.

Thus, it is possible to improve reliability in connection of the pads P and the metal posits M of the wiring board 1 with the bump electrodes 62 of the semiconductor chip 60 through the solders 64.

In the aforementioned mode, the technique for flip-chip connecting a semiconductor chip through a sealing resin material is used to fill the lower side of the semiconductor chip 60 with the sealing resin 50. However, the lower side of the semiconductor chip 60 may be filled with the underfill resin after the semiconductor chip 60 is flip-chip connected.

Another Embodiment

Figure 16:
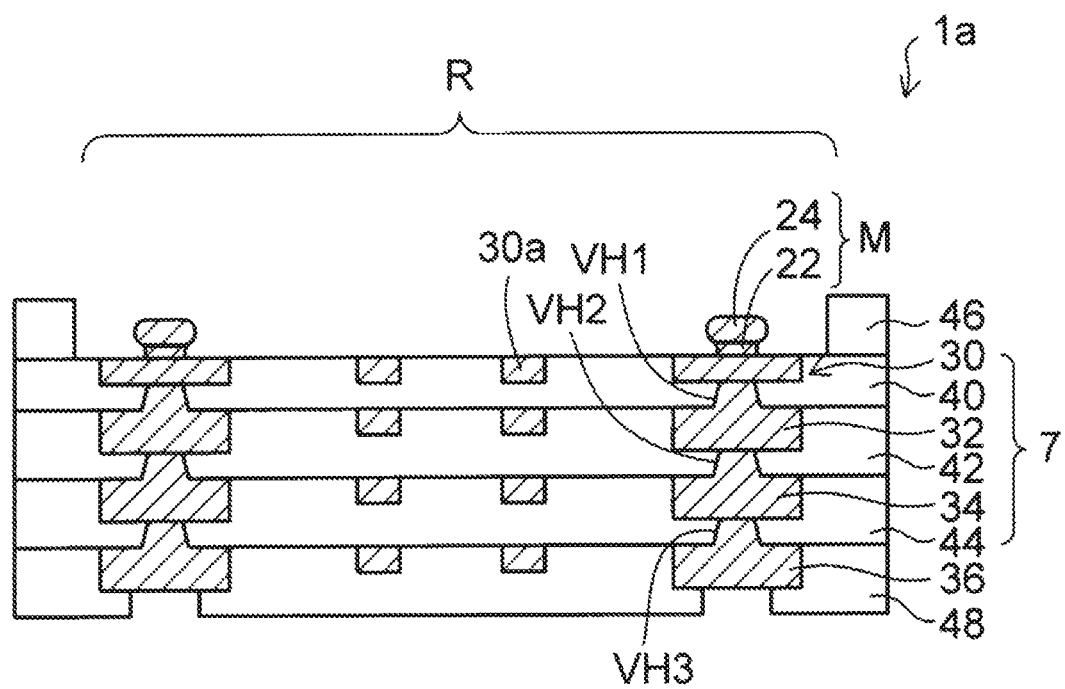
FIG. 16 is a sectional view showing a wiring board according to another embodiment.
Figure 16:
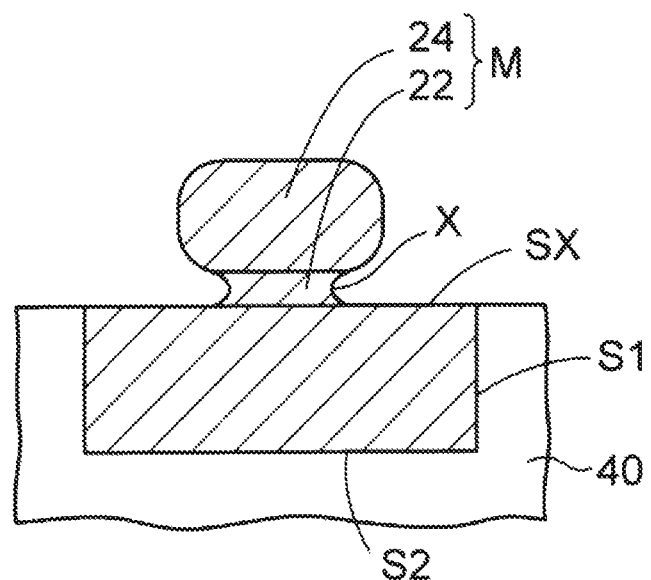

FIG. 16 shows a wiring board 1a according to another embodiment. The wiring board 1a in FIG. 16 is different from the aforementioned wiring board 1 in FIG. 12, in that an upper surface SX of each pad P is set at substantially the same height as an upper surface of a first insulating layer 40. Other elements of the wiring board 1a in FIG. 16 are the same as those of the wiring board 1 in FIG. 12.

A high-performance sheet type spin etcher etc. is used to just etch a second copper foil 22 to such a degree that no residue of the second copper foil 22 is generated. Thus, the pads P can be prevented to the utmost from sinking downward from the upper surface of the first insulating layer 40.

In this manner, the upper surfaces SX of the pads P around metal posts M can be also formed in positions at substantially the same height as the upper surface of the first insulating layer 40.

In the aforementioned wiring board 1 in FIG. 12, when the recesses Y of the pads P are too deep in depth, there is a fear that air caught in the sealing resin material 50a cannot escape to the outside completely but may be trapped in the recesses Y of the pads P in the aforementioned step in FIG. 14B and FIG. 15.

Thus, there may be assumed a case where voids occur in the recesses Y of the pads P so that satisfactory reliability in connection between the bump electrodes 62 of the semiconductor chip 60 and the metal posts M of the wiring board 1 cannot be obtained.

From such a viewpoint, it is preferable that the depth of the recess Y of the pad P around each metal post M can be made as shallow as possible.

As described above, the exemplary embodiment and the modification are described in detail. However, the present invention is not limited to the above-described embodiment and the modification, and various modifications and replacements are applied to the above-described embodiment and the modifications without departing from the scope of claims.

Various aspects of the subject matter described herein are set out non-exhaustively in the following numbered clauses:

1) A method for manufacturing a wiring board, comprising:
   a) preparing a layered substrate comprising a temporary substrate and a metal foil formed on the temporary substrate, wherein the metal foil is removable from the temporary substrate;
   b) forming a wiring layer comprising a pad on the metal foil;
   c) removing the temporary substrate from the metal foil;
   d) forming a metal plating portion on the metal foil such that the metal plating portion is opposed to the pad through an electrolytic plating; and
   e) wet-etching the metal foil using the metal plating portion as a mask, thereby forming a metal post on the pad.

2) The method according to clause (1), wherein the step (d) comprises:
   d-1) forming a plating resist layer having an opening portion on the metal foil such that the opening portion is opposed to the pad;
   d-2) forming the metal plating portion in the opening portion of the plating resist layer; and
   d-3) removing the plating resist layer.

3) The method according to clause (1), wherein in the step (d), an area of the metal plating portion is smaller than that of the pad in a top view.

4) The method according to any one of clause (1), wherein the metal foil and the metal plating portion are made of copper, and
   a mixture solution of sulfuric acid and hydrogen peroxide water is used as an etchant in the step (e).

What is claimed is:

1. A wiring board comprising:
   an insulating layer;
   a pad comprising: an upper surface; a lower surface opposite to the upper surface; and a side surface between the upper surface and the lower surface, wherein the side surface and the lower surface of the pad are embedded in the insulating layer; and
   a metal post formed on the upper surface of the pad and comprising: an upper surface; a lower surface opposite to the upper surface; and a side surface between the upper surface and the lower surface, wherein a narrowed portion is formed in the side surface of the metal post, and wherein an upper end edge portion of the metal post is curved.

2. The wiring board according to claim 1, wherein the upper surface of the metal post is higher in height than an upper surface of the insulating layer.

3. The wiring board according to claim 1, wherein an area of the metal post is smaller than that of the pad in a top view.

4. The wiring board according to claim 1, wherein
   the metal post comprises: a metal plating portion; and a metal foil disposed between the metal plating portion and the upper surface of the pad, and
   the metal foil has the narrowed portion.

5. An electronic component device comprising:
   the wiring board according to claim 1;
   an electronic component comprising a terminal connected to the metal post through a solder; and
   a sealing resin provided between the electronic component and the wiring board.

6. The wiring board according to claim 1, wherein the metal post is formed on a central portion of the upper surface of the pad, and a peripheral portion of the upper surface of the pad, which is outside of the central portion of the upper surface of the pad, is exposed from an upper surface of the insulating layer.

7. The wiring board according to claim 1, wherein a peripheral portion of the upper surface of the pad is disposed at a position lower in height than an upper surface of the insulating layer.

8. The wiring board according to claim 1, wherein a solder resist having an opening portion is formed on an upper surface of the insulating layer, and a plurality of pads, each of which is identical to the pad, and a plurality of metal posts, each of which is identical to the metal post, are exposed through the opening portion.

9. The wiring board according to claim 1, further comprising:
   a first wiring layer comprising: an upper surface; a lower surface opposite to the upper surface; and a side surface between the upper surface and the lower surface, wherein the side surface and the lower surface of the first wiring layer are embedded in the insulating layer, the upper surface of the first wiring layer is exposed from an upper surface of the insulating layer, and the first wiring layer includes the pad and a wiring portion.

10. The wiring board according to claim 9, further comprising:
    a second wiring layer formed on a lower surface of the insulating layer, the second wiring layer connected to the first wiring layer through a via conductor formed in the insulating layer, wherein a diameter of the via conductor increases from the first wiring layer toward the second wiring layer.

11. A wiring board comprising:
    an insulating layer;
    a pad comprising: an upper surface; a lower surface opposite to the upper surface; and a side surface between the upper surface and the lower surface, wherein the side surface and the lower surface of the pad are embedded in the insulating layer; and
    a metal post formed on the upper surface of the pad and comprising: an upper surface; a lower surface opposite to the upper surface; a side surface between the upper surface and the lower surface; a metal plating portion; and a metal foil disposed between the metal plating portion and the upper surface of the pad, wherein a narrowed portion is formed in the side surface of the metal post and the metal foil has the narrowed portion.

12. The wiring board according to claim 11, wherein the upper surface of the metal post is higher in height than an upper surface of the insulating layer.

13. The wiring board according to claim 11, wherein an area of the metal post is smaller than that of the pad in a top view.

14. An electronic component device comprising:
the wiring board according to claim 11;
an electronic component comprising a terminal connected to the metal post through a solder; and
a sealing resin provided between the electronic component and the wiring board.

15. The wiring board according to claim 11, wherein the metal post is formed on a central portion of the upper surface of the pad, and a peripheral portion of the upper surface of the pad, which is outside of the central portion of the upper surface of the pad, is exposed from an upper surface of the insulating layer.

16. The wiring board according to claim 11, wherein a peripheral portion of the upper surface of the pad is disposed at a position lower in height than an upper surface of the insulating layer.

17. The wiring board according to claim 11, wherein a solder resist having an opening portion is formed on an upper surface of the insulating layer, and a plurality of pads, each of which is identical to the pad, and a plurality of metal posts, each of which is identical to the metal post, are exposed through the opening portion.

18. The wiring board according to claim 11, further comprising:
a first wiring layer comprising: an upper surface; a lower surface opposite to the upper surface; and a side surface between the upper surface and the lower surface, wherein the side surface and the lower surface of the first wiring layer are embedded in the insulating layer, the upper surface of the first wiring layer is exposed from an upper surface of the insulating layer, and the first wiring layer includes the pad and a wiring portion.

19. The wiring board according to claim 18, further comprising:
a second wiring layer formed on a lower surface of the insulating layer, the second wiring layer connected to the first wiring layer through a via conductor formed in the insulating layer, wherein a diameter of the via conductor increases from the first wiring layer toward the second wiring layer.

* * * * *